United States Patent
Brown et al.

(10) Patent No.: US 11,359,983 B1
(45) Date of Patent: Jun. 14, 2022

(54) THICKNESS-SHEAR MODE RESONATORS

(71) Applicant: Precis LLC, South Jordan, UT (US)

(72) Inventors: Scott Brown, Riverton, UT (US); Lon Perry, South Jordan, UT (US)

(73) Assignee: Precis LLC, South Jordan, UT (US)

( * ) Notice: Subject to any disclaimer, the term of this patent is extended or adjusted under 35 U.S.C. 154(b) by 99 days.

(21) Appl. No.: 16/898,824

(22) Filed: Jun. 11, 2020

Related U.S. Application Data

(63) Continuation-in-part of application No. 16/374,466, filed on Apr. 3, 2019.

(60) Provisional application No. 62/652,780, filed on Apr. 4, 2018.

(51) Int. Cl.
| | |
|---|---|
| *G01L 9/00* | (2006.01) |
| *G01L 19/14* | (2006.01) |
| *G01L 1/16* | (2006.01) |
| *G01N 29/02* | (2006.01) |
| *H03H 9/02* | (2006.01) |

(52) U.S. Cl.
CPC ............ *G01L 9/0016* (2013.01); *G01L 1/162* (2013.01); *G01L 9/0022* (2013.01); *G01L 19/147* (2013.01); *G01N 29/022* (2013.01); *H03H 9/02023* (2013.01); *B81B 2201/0271* (2013.01)

(58) Field of Classification Search
CPC ..... G01L 9/0016; G01L 1/162; G01L 9/0022; G01L 19/147; G01N 29/022; H03H 9/02023; B81B 2201/0271
See application file for complete search history.

(56) References Cited

U.S. PATENT DOCUMENTS

| | | | |
|---|---|---|---|
| 5,233,261 A | 8/1993 | Wajid | |
| 5,578,759 A * | 11/1996 | Clayton | G01K 7/32 310/338 |
| 6,131,462 A | 10/2000 | Eernisse et al. | |
| 6,196,059 B1 | 3/2001 | Koesslinger | |
| 2009/0009036 A1* | 1/2009 | Matsumoto | G01L 19/04 310/348 |
| 2010/0242615 A1* | 9/2010 | Sato | G01L 9/0022 73/702 |
| 2011/0283801 A1* | 11/2011 | Matsumoto | G01L 9/0022 73/702 |
| 2015/0059483 A1* | 3/2015 | Puccio | G01L 19/0092 73/702 |

(Continued)

FOREIGN PATENT DOCUMENTS

WO  WO-2015006536 A1 *  1/2015  ......... H03H 9/02062

OTHER PUBLICATIONS

U.S. Appl. No. 62/652,780, filed Apr. 4, 2018.

(Continued)

*Primary Examiner* — Ryan D Walsh
(74) *Attorney, Agent, or Firm* — Workman Nydegger

(57) ABSTRACT

A quartz pressure sensor that resonates in the thickness-shear mode can include a center resonator structure and first and second caps joined to the center resonator structure by bond joints. Each bond joint is comprised of a sealing glass having thickness less than 0.0012 inches (~30 μm) and a melting point less than 573° C. The quartz pressure sensor can additionally include an inner diameter edge feature formed between the interior sidewall in the joint sidewall of the caps that reduces stresses at the bond joints and/or a high stress point in the cap bore.

20 Claims, 5 Drawing Sheets

(56) References Cited

U.S. PATENT DOCUMENTS

2017/0350780 A1* 12/2017 Daito .................. G01L 9/08

OTHER PUBLICATIONS

U.S. Appl. No. 16/374,466, filed Apr. 3, 2019.
U.S. Appl. No. 62/652,782, filed Apr. 4, 2018.
U.S. Appl. No. 16/374,476, filed Apr. 3, 2019.
Requirement for Restriction/Election received for U.S. Appl. No. 16/374,476, dated Aug. 20, 2021, 6 pages.

* cited by examiner

THICKNESS-SHEAR MODE RESONATORS

CROSS-REFERENCE TO RELATED APPLICATIONS

This application is a continuation-in-part of U.S. application Ser. No. 16/374,466, filed Apr. 3, 2019, and entitled THICKNESS-SHEAR MODE RESONATORS, which claims priority to and the benefit of U.S. Provisional Application No. 62/652,780, filed Apr. 4, 2018, and entitled THICKNESS-SHEAR MODE RESONATORS, the entire content of each of which is incorporated herein by reference.

BACKGROUND

Technical Field

This disclosure generally relates to pressure sensors. More specifically, the present disclosure relates to quartz pressure sensors that resonate in the thickness-shear mode (TSM).

Related Technology

Petroleum is the lifeblood of modern industrialized society. Petroleum is extracted from petroleum reservoirs and refined into myriad products, including fuel for powering combustion engines (e.g., diesel fuel, jet fuel, and octane) or providing heat (e.g., kerosene). Additionally, olefinic and paraffinic hydrocarbons are generated during the refining process, and these compounds are foundational in the manufacturing of many plastics. Because of its utility and rich potential, there is a continual demand for petroleum. However, extracting and refining petroleum is a tremendously time and resource intensive process. Due to a variety of technical and geological obstacles, it is difficult, if not entirely improbable, to recover all of the petroleum contained in a reservoir. Even with advances in drilling and extraction technologies, the average recovery from a petroleum reservoir is about 35% of the available petroleum. While this represents a significant increase in the average petroleum recovery in recent years, it also means that about 65% of the petroleum found in a typical reservoir remains unrecovered from an economic and/or technical standpoint.

With regard to reservoir productivity, operators are burdened with monitoring and analyzing each individual well in an effort to maximize the rate of petroleum extraction, or well productivity. Well productivity is influenced by a number of disparate factors, including, for example, extraction volume, reservoir pressure, temperature, bore path, fluid profiles in production and injection wells, injection rates and/or pressures, among others. Access to accurate and dependable, real-time measurements are imperative for maximizing well productivity and for understanding the complexities and interrelated effects each well has with respect to aggregate productivity for an entire reservoir and/or oil field. Accordingly, there is a need for responsive and reliable sensors, including, for example, pressure sensors.

Pressure in oil/gas wells can be measured using various sensor technologies. One such technology includes a pressure transducer comprised of a piezoelectric resonator located within a housing that responds to environmental pressures. For example, a quartz TSM resonator is a type of pressure sensor that has been used successfully in downhole environments of oil and gas wells to accurately determine downhole pressures. Most quartz TSM resonators include a quartz TSM crystal disposed within a resonator housing exposed to ambient downhole or bottom-hole fluid pressure. The quartz TSM resonator is coupled to an electrical circuit, and because quartz is a piezoelectric material, the electrical circuit can be used to oscillate the quartz TSM crystal located inside the housing. The frequency of the quartz TSM crystal oscillations can be measured and are primarily a function of the observed environmental pressure. Consequently, changes in the frequency of the quartz TSM crystal within the quartz TSM resonator correspond to changes in the observed environmental pressure.

Typically, a quartz TSM resonator is cylindrical in shape and is comprised of three components: a center resonator structure (e.g., a quartz TSM crystal) and two hollowed caps bonded to the center resonator structure. The bonded caps act to isolate the center resonator structure from the surrounding downhole fluids, allowing it to freely resonate in the center. Unfortunately, current bonding materials and practices for bonding the center resonator structure to the end caps negatively affects the performance of quartz TSM resonators, reducing the reliability of sensor data, and thereby threatening the efficiency of well productivity and net asset recovery.

Accordingly, there are a number of disadvantages and improvements to be made to TSM resonators that can be addressed.

BRIEF SUMMARY

Embodiments of the present disclosure solve one or more of the foregoing or other problems in the art with TSM resonators. In particular, embodiments disclosed herein include a quartz pressure sensor, which can include a TSM resonator, that demonstrate improved stability and aging/drift of the crystal over long measurement periods. For example, an exemplary quartz pressure sensor includes a center resonator structure and a housing bonded to the center resonator structure. The housing can include a first cap bonded to a first side of the center resonator structure with a sealing glass, forming a first joint, and a second cap bonded to a second side of the center resonator structure with the sealing glass, forming a second joint. A sensor with such a configuration can be referred to as a butt-joint sensor. One or more of the first joint or the second joint has a thickness of less than or equal to about 0.001 inches (~26 μm) or less than or equal to about 0.0012 inches (~30 μm), and in at least one embodiment, the thin glass joint offers increased bond strength and reduced stress.

Exemplary quartz resonators can additionally include an inner diameter formed between the interior sidewall of the cap and the joint sidewall of the cap, the joint sidewall being nearly transverse and connecting to the interior sidewall. The inner diameter can have an edge feature (e.g., a radius or chamfer edge having particular dimensions), which in some embodiments reduces stress at the glass bond joint and/or the high stress point in the cap bore, providing improved stability and/or sensitivity of the crystal sensor over long measurement periods.

The present disclosure also includes systems for measuring downhole pressure of an oil-producing well. The system can include a quartz TSM resonator having a center resonator structure and a housing bonded to the center resonator structure. A glass bond joint can be formed between the center resonator structure and the housing and have a thickness of less than or equal to about 0.001 inches (~26 μm) or less than or equal to about 0.0012 inches (~30 μm). The housing can additionally include a first cap having an interior sidewall, the interior sidewall defining a bore cap, and a joint sidewall transverse and connecting to the interior sidewall. The bore in the cap may have a generally straight bore (e.g., the entry walls into the bore are generally parallel to one another and/or nearly perpendicular to the face of the cap), an angled bore (e.g., the entry walls into the bore are not parallel to one another and/or are not perpendicular to the face of the cap), or a curved bore (e.g., the angle of the entry walls into the bore are curved). The first cap can include an inner diameter with an edge feature that is formed between the interior sidewall and the joint sidewall. In some embodiments, the size and shape of the edge feature reduces stress at the glass bond joint by 5%-50% and/or reduces a high stress point in the cap bore between about 5%-15%.

A method of manufacturing a TSM quartz pressure sensor includes forming a glass bond joint having a thickness less than or equal to about 0.001 inches (~26 μm) or less than or equal to about 0.0012 inches (~30 μm) between a center resonator structure and a first cap. The first cap can include an inner diameter with an edge feature formed between an interior sidewall and a joint sidewall thereof. In some implementations of the exemplary methods, the edge feature reduces (i) stress at the glass bond joint by about 5%-50% compared to a chamfered or radiused edge having different dimensions and/or configurations and/or (ii) reduces a high stress point in the cap bore between about 5%-15% compared to a chamfered or radiused edge having different dimensions and/or configurations.

Accordingly, a TSM resonator and systems and methods incorporating the same are disclosed.

This summary is provided to introduce a selection of concepts in a simplified form that are further described below in the detailed description. This summary is not intended to identify key features or essential features of the claimed subject matter, nor is it intended to be used as an indication of the scope of the claimed subject matter.

Additional features and advantages of the disclosure will be set forth in the description which follows, and in part will be obvious from the description, or may be learned by the practice of the disclosure. The features and advantages of the disclosure may be realized and obtained by means of the instruments and combinations particularly pointed out in the appended claims. These and other features of the present disclosure will become more fully apparent from the following description and appended claims or may be learned by the practice of the disclosure as set forth hereinafter.

BRIEF DESCRIPTION OF THE DRAWINGS

In order to describe the manner in which the above recited and other advantages and features of the disclosure can be obtained, a more particular description of the disclosure briefly described above will be rendered by reference to specific embodiments thereof, which are illustrated in the appended drawings. It is appreciated that these drawings depict only typical embodiments of the disclosure and are not therefore to be considered to be limiting of its scope. The disclosure will be described and explained with additional specificity and detail through the use of the accompanying drawings in which.

DETAILED DESCRIPTION

Figure 1:
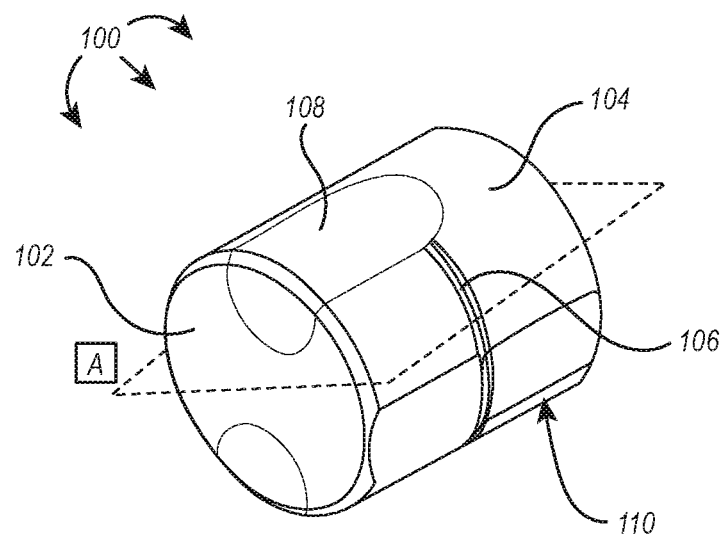
FIG. 1 illustrates a top perspective view of an exemplary assembled quartz TSM resonator.

Before describing various embodiments of the present disclosure in detail, it is to be understood that this disclosure is not limited to the parameters of the particularly exemplified systems, methods, apparatus, products, processes, and/or kits, which may, of course, vary. Thus, while certain embodiments of the present disclosure will be described in detail, with reference to specific configurations, parameters, components, elements, etc., the descriptions are illustrative and are not to be construed as limiting the scope of the claimed invention. In addition, the terminology used herein is for the purpose of describing the embodiments and is not necessarily intended to limit the scope of the claimed invention.

As provided above, there are a number of factors that can affect the productivity of an oil-producing well. For example, being able to accurately measure the downhole reservoir pressure over long periods of time can have a tremendous impact on well productivity and the efficient extraction of oil from a given reservoir.

Pressure sensors, including the specialized TSM resonators, are commonly used in downhole environments to measure the reservoir pressure in an oil-producing well. A typical TSM resonator includes a disc-shaped center resonator structure disposed within a tubular cylindrical housing assembly, the ends of which are closed, and electrodes associated with the TSM resonator that vibrate the center resonator structure. By reverse piezoelectric effect, the resonant frequency of the center resonator structure can be determined, and when subjected to exterior pressure, the cylindrical housing assembly elastically deforms, thereby causing the frequency of the center resonator structure to shift. Accordingly, the frequency output from the center resonator structure is indicative of the local pressure and can be used to accurately measure, for example, reservoir pressure.

Because of its piezoelectric properties, quartz is an ideal material to be used in both the center resonator structure of TSM resonators as well as in the housing. However, quartz crystal is a relatively hard material prone to chipping. The structures of the TSM resonator are ground to shape using diamond tools, and traditionally sharp edges have been chamfered or radiused to avoid accidental breaks or fractures in the material.

While chamfered or radiused edges may reduce accidental breaks or fractures, it has been heretofore unappreciated that chamfered or radiused edges with certain dimensions and/or configurations can also inadvertently generate stress points at the glass joint and within the cap bore that can individually and collectively reduce the stability and sensitivity of the resonator structure over long measurement periods.

Accordingly, there are a number of disadvantages and improvements to be made to TSM resonators that can be addressed.

Briefly, embodiments of the present disclosure include quartz TSM resonators having a relatively thin bond joint thickness. In some embodiments, the bond joint thickness may be in a range of between about 6 μm (0.00023 inches) and about 30 μm (0.0012 inches), between about 6 μm (0.00023 inches) and about 26 μm (0.001 inches), between about 6 μm (0.00023 inches) and about 20 μm (0.0008 inches), between about 6 μm (0.00023 inches) and about 10 μm (0.0004 inches), between about 6 μm (0.00023 inches) and about 9 μm (0.00035 inches), between about 11 μm (0.00043 inches) and about 26 μm (0.001 inches), between about 11 μm (0.00043 inches) and about 20 μm (0.0008 inches), or between about 15 μm (0.0006 inches) and about 18 μm (0.0007 inches). In some embodiments, the bond joint thickness may be about 6 μm (0.00023 inches), less than about 10 μm (0.0004 inches), or about 20 μm (0.0008 inches).

Additionally, or alternatively, the quartz TSM resonators disclosed herein may include a housing cap with an inner diameter edge feature that at least partially defines the cap bore. The foregoing individually and/or collectively reduce stress and improve the stability and sensitivity of quartz TSM resonators over long measurement periods. Additionally, the bond joint thicknesses described herein can specifically increase bond strength and improve aging/drift of the crystal over long measurement periods.

Quartz TSM Resonators having a Thin Glass Joint

Figure 2:
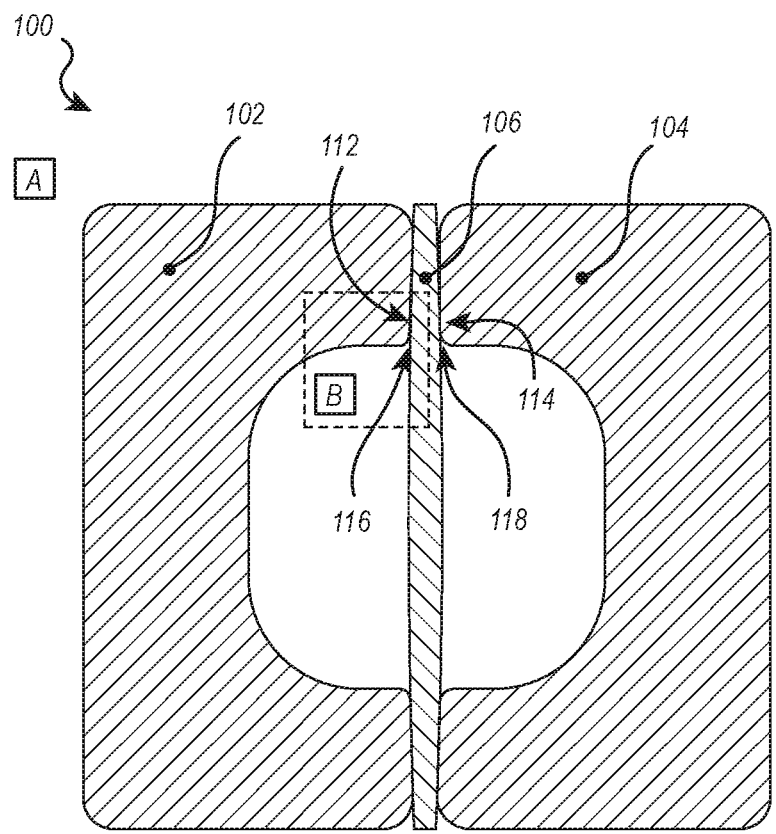
FIG. 2 illustrates a cross-sectional view of the quartz TSM resonator of FIG. 1 taken along plane A, as indicated in FIG. 1.

Referring now to the figures, FIGS. 1 and 2 illustrate an exemplary quartz TSM resonator 100. In the top perspective view of FIG. 1, the quartz TSM resonator 100 includes a top cap 102 and a bottom cap 104 bonded to a center resonator structure 106 and associated with electrodes 108. It should be appreciated that any of the top cap 102, the bottom cap 104, and/or the center resonator structure 106 can include quartz crystal that is cut in accordance with its intended use and as known in the art. For example, the center resonator structure 106 can include an AT-cut crystal, a near AT-cut crystal, a BT-cut crystal, an RT-cut crystal, or an SBTC-cut crystal. Preferably, an AT-cut crystal or near AT-cut crystal is used for pressure sensing applications described herein.

The electrodes 108 can be made of or include any conductive material known in the art, including, for example, gold-plated chrome, gold-plated nickel, or gold-plated titanium. Examples of such electrodes, as known in the art, include those disclosed in at least U.S. Pat. Nos. 5,233,261 and 6,196,059, the disclosures of which are incorporated herein by reference. The electrodes 108 can further be attached to an electrical circuit for determining the frequency of the resonating crystal, as known in the art.

As shown in FIG. 1, the quartz TSM resonator 100 additionally includes a flat 110 that can be used to align each of the top cap 102, the bottom cap 104, and/or the center resonator structure 106. In some embodiments, the resonator 100 may include a single flat 110 or multiple flats.

Referring now to FIG. 2, which illustrates a cross-section (A) of the quartz TSM resonator 100 of FIG. 1, the top cap 102 and the bottom cap 104 are bonded to the center resonator structure 106, forming bond joint 112 (between the top cap 102 and the center resonator structure 106) and 114 (between the bottom cap 104 in the center resonator structure 106). The bond joints 112, 114 are preferably made using a sealing glass that, when fired, bonds the components of the quartz TSM resonator together. Glass bonding is preferred as metal bonding would interfere with the electrodes on the resonator structure and direct quartz bonding is impractical given manufacturing limitations of the center resonator structure 106 and caps 102, 104.

In some embodiments, the sealing glass has a melting point below 573° C., the Curie point of crystalline quartz. The sealing glass can be applied to one or more of the top and bottom caps 102, 104 and/or the center resonator structure 106 as a tape, paste, or slurry. In a preferred embodiment, glass frit in tape form can be applied to the joint sidewall of the top and bottom caps 102, 104 and assembled about the center resonator structure 106 followed by firing to form the bond joints 112, 114. Alternatively, the sealing glass can be incorporated into a paste and/or slurry and screen-printed onto one or more of the top cap 102, bottom cap 104, and/or center resonator structure 106 followed by firing to form the bond joints 112, 114. Alternatively, the sealing glass can be incorporated into a dry-powder-pressed preform that is placed onto one or more of the top cap 102, bottom cap 104, and/or center resonator structure 106 followed by firing to form the bond joints 112, 114.

Figure 3:
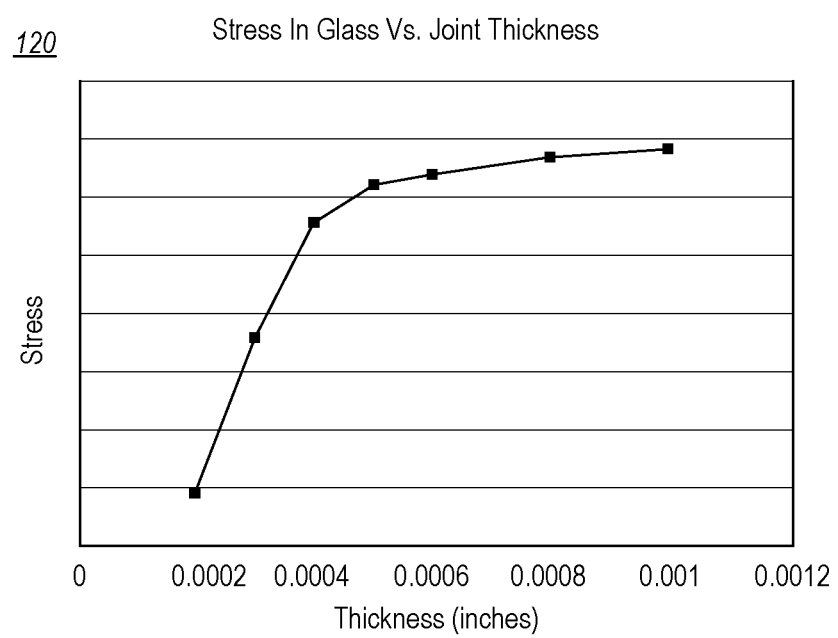
FIG. 3 illustrates a graph of the amount of stress experienced within the glass joint between the cap and central resonating structure as a function of joint thickness.

Stresses experienced at the bond joint can negatively affect the stability of TSM resonators. As shown in FIG. 3, it was surprisingly shown that thinner bond joints 112, 114 can increase the bond strength between the caps 102, 104 and the center resonator structure 106 and may additionally reduce the amount of stress experienced at the bond joints 112, 114. Particularly, when comparing the stress experienced in a bond joint as a function of joint thickness (as shown in the chart of FIG. 3), bond joints 112, 114 less than about 0.0008 inches (~20 μm) experience less stress than bond joints used in current TSM resonators.

In some embodiments, the bond joints 112, 114 have an upper bound thickness of about 0.0008 inches (~20 μm) and a lower bound thickness of about 0.0001 inches (~2.5 μm). The upper bound thickness of the glass bond joints 112, 114 can be selected based on a tolerated amount of stress. In some embodiments, it may be desirable to have a lower tolerated amount of stress at the bond joints 112, 114, and consequently, a lower upper bound thickness is desirable. The upper bound thickness can be selected from any of about 0.0012 inches (~30 μm), about 0.001 inches (~26 μm), about 0.0008 inches (~20 μm), about 0.0007 inches (~18 μm), about 0.0006 inches (~15 μm), about 0.0005 inches (12.75 μm), about 0.0004 inches (~10 μm), about 0.0003 inches (~7.5 μm), about 0.00023 inches (~6 μm), or about 0.0002 inches (~5 μm).

The lower bound thickness may, in some embodiments, be bounded by the amount of sealing glass that can be consistently and accurately deposited or placed on one or more surfaces of the TSM resonator to be bound and/or by the degree of matched surfaces between the resonator and the upper and lower caps. Accordingly, the lower bound thickness of the bond joints 112, 114 may, in some embodiments be about 0.0002 inches (~5 μm), about 0.00023 inches (~6 μm), about 0.0003 inches (~7.5 μm), about 0.0004 inches (~10 μm), or about 0.0005 inches (12.75 μm).

It should be appreciated that the thickness of the bond joints 112, 114 can be selected from a range of thicknesses defined by any of the lower bound thicknesses and upper bound thicknesses disclosed above. For example, the bond joints 112, 114 can have a thickness between about 0.0002 inches (~5 μm) to about 0.0005 inches (12.75 μm), which is advantageously associated with a sharp decrease in the amount of stress experienced at the bond joints 112, 114 (as shown in FIG. 3).

As provided above, thinner bond joint thicknesses can result in increased bond strength and reduced stress, resulting in improved aging/drift of the crystal over long measurement periods. Such improvements can result in an increased stability of quartz TSM resonators and/or increased production efficiency at corresponding oil producing wells—among other benefits.

Quartz TSM Resonators having an Inner Diameter Edge Feature

Stresses at the bond joints, as described above, can negatively impact the stability and/or sensitivity of quartz TSM resonators, and it can be important to minimize/reduce stress levels or optimize stress levels in the quartz structure to enable a more stable and/or sensitive sensor. Traditional quartz TSM resonators include caps with cap bores that are defined by interior sidewalls of the caps, and the cap bores allow the crystal resonator to freely resonate in the center bore defined by the joined caps. When shaping the caps, the inner diameter edge formed between the interior sidewall and the joint surface of each cap has traditionally been chamfered or radiused to remove the sharp edge formed therebetween that could potentially chip. Previous caps have included a radius/fillet or a chamfer with short-side lengths of 0.015 inches (~381 µm) to 0.020 inches (~508 µm). However, because of the dimensions and/or configurations of the previously used chamfered or radiused edges, adding such radiuses or chamfers unintentionally formed additional stress points to the quartz structure. By forming the inner diameter as an edge feature (e.g., a radius or chamfer edge having particular dimensions and/or configurations) between the interior sidewall and the joint surface as disclosed herein, the stress at the glass bond interfaces between the caps and center resonator structures can be reduced, thereby forming a more stable and/or sensitive structure.

With reference to FIG. 2, the quartz TSM resonators 100 of the present disclosure can include inner diameter edge features 116, 118 formed between an interior sidewall and a joint surface of the corresponding caps 102, 104. As discussed in more detail below, the inner diameter edge features 116, 118 may take the form of a radius/fillet edge or a chamfer edge having particular dimensions and/or configurations to produce desired characteristics. It should be appreciated that the radius of a circle whose arc length defines the inner diameter edge feature 116, 118 can be of any length such that the arclength formed thereby (e.g., the inner diameter edge feature 116, 118) is not so long as to make the inner diameter edge appear substantially flat—similar to a chamfered edge—and is not so short as to make the inner diameter edge (substantially or practically) a sharp point.

The inner diameter edge features 116, 118 can be created using, for example, a CNC grinder or by any other means known in the art. As will be described below, the edge features 116, 118 may be formed with a radius/fillet or a chamfer with specified dimensions in order to provide the quartz TSM resonator 100 with desired stability and/or sensitivity characteristics.

In some embodiments, it may be desirable to reduce the average stress at the glass bond joints 112, 114. The average stress is measured across all nodes at the glass bond joints 112, 114. In some embodiments, reducing the average stress at the glass bond joints 112, 114 may increase the sensitivity of the quartz TSM resonator 100 by more completely transferring for forces from the caps 104, 104 to the center resonator structure 106.

Figure 4A:
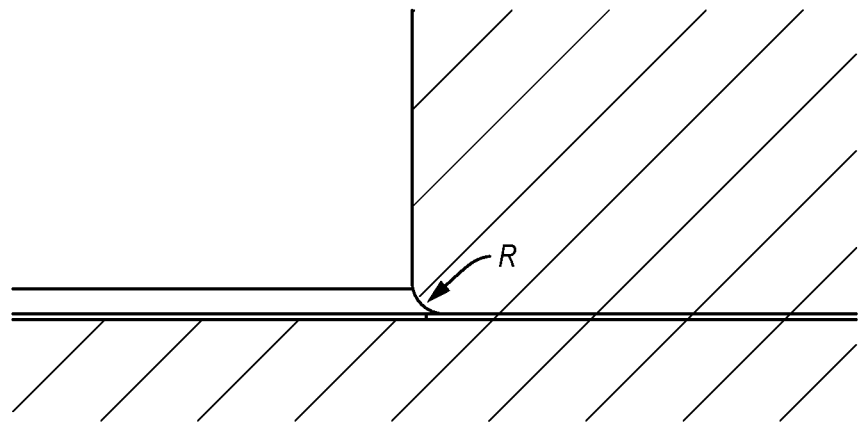
FIGS. 4A-4E each illustrate cross-sectional views of portions of quartz TSM resonator caps with an inner diameter edge features according to embodiments of the present disclosure.

One way to reduce the average stress at the glass bond joints 112, 114 is by reducing the relevant dimensions of the edge features 116, 118. By way of example, as shown in FIG. 4A, the edge features 116, 118 may be formed with a radius/fillet edge having a radius R of less than 0.015 inches (~381 µm), between about 0.0001 inches to about 0.005 inches (~2.54 µm-~127 µm), or about 0.000 inches (~0 µm).

Figure 4B:
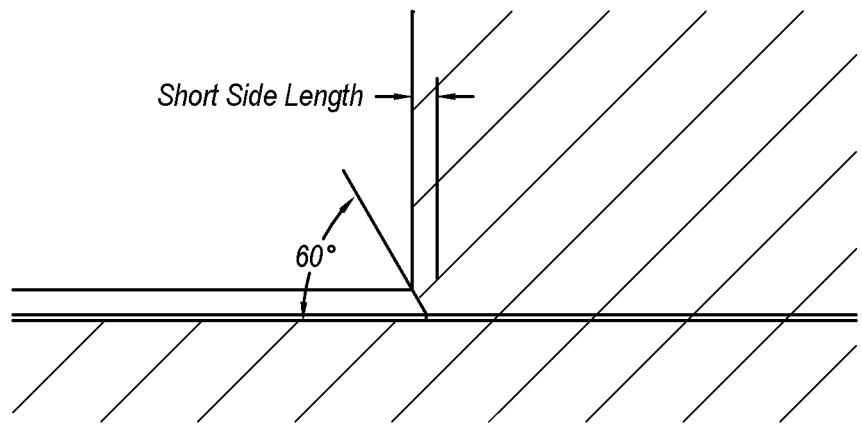
Figure 4C:
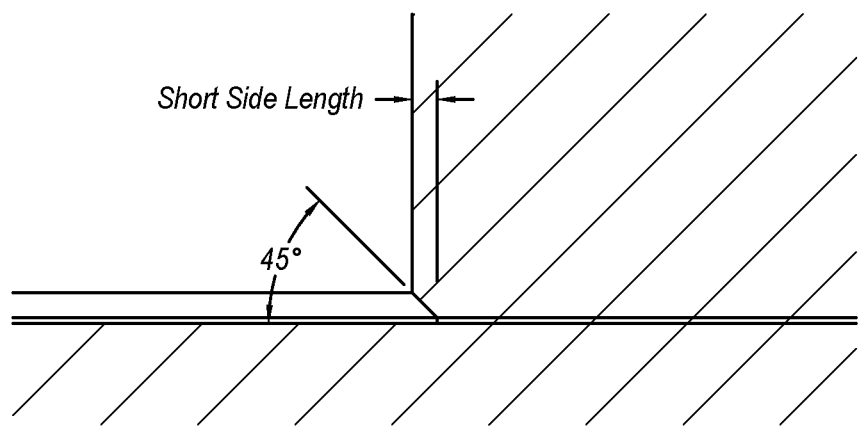
Figure 4D:
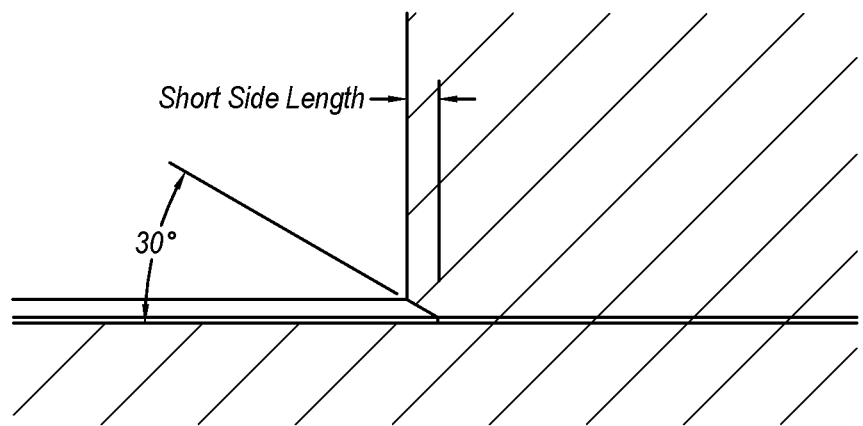

Alternatively, the edge features 116, 118 may be formed with a chamfered edge. As noted elsewhere herein, chamfered edges have been used in previous quartz TSM resonators. In previous resonators, the chamfered edges have ranged in size from 0.015 inches to 0.020 inches (381 µm to 508 µm) with angles ranging from 20 degrees to 45 degrees. In contrast, chamfered edges according to the present embodiments may have substantially any angle (e.g., greater than 0 degrees and less than 90 degrees) and the length of the short side of the chamfer may be less than 0.015 inches (381 µm). In some embodiments, the length of the short side of the chamfer may be between about 0.0001 inches to about 0.005 inches (~2.54 µm to ~127 µm). FIGS. 4B-4D illustrate three example chamfers with angles of 60 degrees, 45 degrees, and 30 degrees, respectively. In each case, the length of the short side of the chamfer is less than 0.015 inches (381 µm).

Figure 4E:
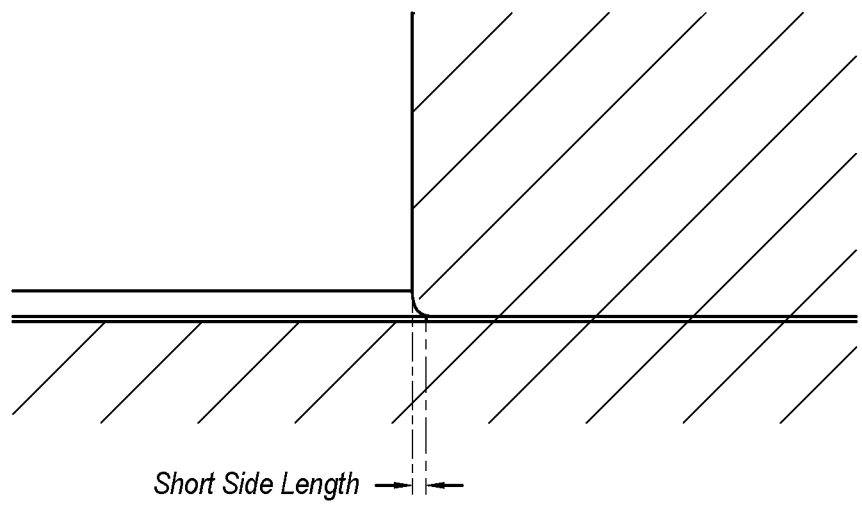

In still other embodiments, the edge features 116, 118 may be formed with a partial radius or hybrid radius/chamfered edge. For instance, as shown in FIG. 4E, the edge feature may include a rounded chamfered surface. As with the previously noted chamfered edges, the partial radius or hybrid radius/chamfered edge may have substantially any angle (e.g., greater than 0 degrees and less than 90 degrees, about 60 degrees, about 45 degrees, about 30 degrees) and the length of the short side of the hybrid radius/chamfered edge may be less than 0.015 inches (381 µm). In some embodiments, the length of the short side may be between about 0.0001 inches to about 0.005 inches (~2.54 µm to ~127 µm).

Figure 5:
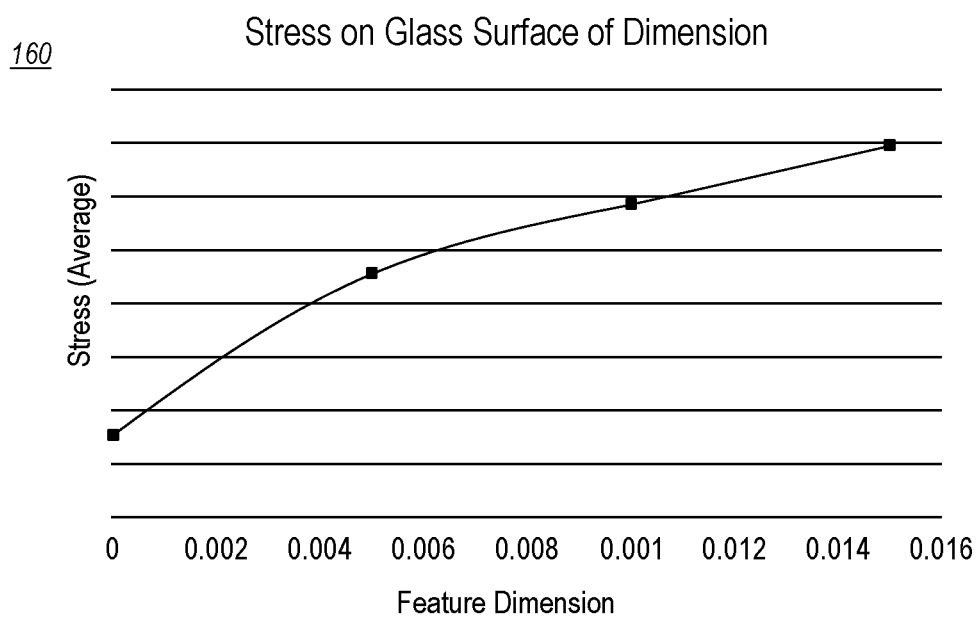
FIG. 5 illustrates a graph of the amount of average stress experienced at a glass joint between the cap and central resonating structure as a function of the inner diameter edge feature dimension.

As shown in the graph 160 of FIG. 5, the average stress in the glass joint decreases when the dimension of the inner edge features 116, 118 is reduced. In particular, the average stress decreases significantly when the dimension of the inner edge features 116, 118 is less than 0.015 inches (381 µm). The average stress decreases even more dramatically when the dimension of the inner edge features 116, 118 is less than about 0.005 inches (~127 µm). For instance, for an inner edge feature dimension of about 0.01 inches (~254 µm), the average stress is about 9% lower than for an inner edge feature dimension of 0.015 inches (381 µm). Similarly, for an inner edge feature dimension of about 0.005 inches (~127 µm), the average stress is about 20% lower than for an inner edge feature dimension of 0.015 inches (381 µm). Likewise, for an inner edge feature dimension of about 0.000 inches (~0 µm), the average stress is about 45% lower than for an inner edge feature dimension of 0.015 inches (381 µm). Accordingly, in some embodiments, the internal inner edge features 116, 118 may have a radius (for radius/fillet edges) or short-side length (for chamfered edges) of less than 0.015 inches (381 µm), between about 0.0001 inches and about 0.005 inches (~2.54 µm and ~127 µm), or about 0.000 inches (~0 µm).

The edge features 116, 118 with radius or short-side length dimensions of less than 0.015 inches (381 µm) transfer less average stress to the bond joints 112, 114 as compared to a chamfered cap having a chamfer with a short-side length of 0.015 inches to 0.020 inches (381 µm to 508 µm). In some embodiments, the dimensions and/or configurations of the edge features 116, 118 reduce the average stress at the glass bond interface by about 9%, 20%, or 45% compared to previous caps with radiused or chamfered edges with radii or short-side lengths of 0.015 inches to 0.020 inches (381 µm to 508 µm). Accordingly, it should be appreciated that the edge features 116, 118 can reduce average stress, in at least some embodiments, at the glass bond interface by between about 5%-50%, between about 9%-45%, or between any range selected between about 5% and 100%.

As provided above, having an inner diameter edge feature can result in reduced stress within the quartz TSM resonator, and such reduced stress can improve the stability and/or sensitivity of the crystal over long measurement periods. Such improvements can result in an increased production efficiency at corresponding oil producing wells—among other benefits.

According to one embodiment, a system for measuring downhole pressure of an oil producing well includes a thickness-shear mode (TSM) quartz resonator. The TSM quartz resonators may include a center resonator structure and a housing bonded to the center resonator structure. A glass bond joint may be formed between the center resonator structure and the housing. The glass bond joint may have a thickness of less than about 0.0008 inches (~20 μm).

In some embodiments, the housing includes a first cap having an interior sidewall that may define a cap bore. The first cap can also include a joint sidewall transverse and connecting to the interior sidewall. In some embodiments, the first cap also includes an inner diameter edge feature formed between the interior sidewall and the joint sidewall. In some embodiments, the inner diameter edge feature is formed with a radius/fillet edge having a radius of less than 0.015 inches (381 μm), between about 0.0001 inches to about 0.005 inches (~2.54 μm to ~127 μm), or about 0.000 inches (~0 μm). In other embodiments, the inner diameter edge feature is formed as a chamfer with a short-side dimension of less than 0.015 inches (381 μm) or between about 0.0001 inches to about 0.005 inches (~2.54 μm to ~127 μm). In some embodiments, the inner diameter edge feature can reduce stress at the glass bond joint compared to a previously used radiused or chamfered edge (e.g., with a radius or short-side dimension of 0.015 inches to 0.020 inches (381 μm to 508 μm)) by about 5%-50%. In some embodiments, the edge feature can reduce a high stress point in the cap bore between about 5%-15% compared to a previously used radiused or chamfered edge (e.g., with a radius or short-side dimension of 0.015 inches to 0.020 inches (381 μm to 508 μm)).

In some embodiments, a system for measuring downhole pressure of an oil producing well can includes a thickness-shear mode (TSM) quartz resonator. The TSM quartz resonator can include a center resonator structure and a housing bonded to the center resonator structure at a bond joint. The housing can include a first cap having an interior sidewall that defines a cap bore. The first cap can also include a joint sidewall transverse and connecting to the interior sidewall. An inner diameter can be formed between the interior sidewall and the joint sidewall with the inner diameter having an edge feature. In some embodiments, the edge feature is formed with a radius/fillet edge having a radius of less than 0.015 inches (381 μm), between 0.0001 inches to 0.005 inches (~2.54 μm to ~127 μm), or about 0.000 inches (~0 μm). In other embodiments, the edge feature is formed as a chamfer with a short-side dimension of less than 0.015 inches (381 μm) or between about 0.0001 inches to about 0.005 inches (~2.54 μm to ~127 μm). In some embodiments, the edge feature can reduce stress at the bond joint by about 5%-50% compared to a previously used radiused or chamfered edges (e.g., with a radius or short-side dimension of 0.015 inches to 0.020 inches (381 μm to 508 μm)). In some embodiments, the edge feature can reduce a high stress point in the cap bore between about 5%-15% compared to a previously used radiused or chamfered edges (e.g., with a radius or short-side dimension of 0.015 inches to 0.020 inches (381 μm to 508 μm)). In some embodiments, the bond joint is formed with a sealing glass and has a thickness of less than about 0.0008 inches (~20 μm).

In some embodiments, a method of manufacturing a quartz pressure sensor that resonates in the thickness-shear mode includes forming a first cap with an inner diameter edge feature formed between an interior sidewall and a joint sidewall thereof. In some embodiments, the inner diameter is formed with a radius/fillet edge having a radius of less than 0.015 inches (381 μm), between about 0.0001 inches to about 0.005 inches (~2.54 μm to ~127 μm), or about 0.000 inches (~0 μm). In other embodiments, the edge feature is formed as a chamfer with a short-side dimension of less than 0.015 inches (381 μm) or between 0.0001 inches to 0.005 inches (~2.54 μm to ~127 μm). The method can also include bonding the first cap to a center resonator structure at a bond joint.

In some embodiments, the edge feature reduces stress at the bond joint by about 5%-50% compared to a previously used radiused or chamfered edges (e.g., with a radius or short-side dimension of 0.015 inches to 0.020 inches (381 μm to 508 μm)). In some embodiments, the first cap also includes a bore cap defined by the interior sidewall, and the edge feature reduces a high stress point in the cap bore between about 5%-15%. In some embodiments, the method also includes forming a second cap with an inner diameter formed between an interior sidewall and a joint sidewall thereof, the inner diameter having a second edge feature, and bonding the second cap to the center resonator structure at a second bond joint.

CONCLUSION

Any headings used herein are for organizational purposes only and are not meant to be used to limit the scope of the description or the claims.

Unless defined otherwise, all technical and scientific terms used herein have the same meaning as commonly understood by one of ordinary skill in the art to which the present disclosure pertains. Various aspects of the present disclosure, including devices, systems, and methods may be illustrated with reference to one or more embodiments or implementations, which are exemplary in nature. As used herein, the term "exemplary" means "serving as an example, instance, or illustration," and should not necessarily be construed as preferred or advantageous over other embodiments disclosed herein.

As used herein, directional terms, such as "top," "bottom," "left," "right," "up," "down," "upper," "lower," "proximal," "adjacent," "distal" and the like are used herein solely to indicate relative directions and are not otherwise intended to limit the scope of the disclosure and/or claimed invention.

To facilitate understanding, like reference numerals (i.e., like numbering of components and/or elements) have been used, where possible, to designate like elements common to the figures. Specifically, in the exemplary embodiments illustrated in the figures, like structures, or structures with like functions, will be provided with similar reference designations, where possible.

The present disclosure may be embodied in other specific forms without departing from its spirit or essential characteristics. The described embodiments are to be considered in all respects only as illustrative and not restrictive. The scope of the invention is, therefore, indicated by the appended claims rather than by the foregoing description. While certain embodiments and details have been included herein and in the attached disclosure for purposes of illustrating embodiments of the present disclosure, it will be apparent to those skilled in the art that various changes in the methods, products, devices, and apparatus disclosed herein may be made without departing from the scope of the disclosure or of the invention, which is defined in the appended claims. All changes which come within the meaning and range of equivalency of the claims are to be embraced within their scope.

What is claimed is:

1. A quartz pressure sensor that resonates in a thickness-shear mode, comprising:
a center resonator structure; and
a housing bonded to the center resonator structure, the housing comprising:
a first cap bonded to a first side of the center resonator structure, forming a first joint; and
a second cap bonded to a second side of the center resonator structure, forming a second joint,
wherein the first cap or the second cap comprises:
an interior sidewall, the interior sidewall defining a cap bore;
a joint sidewall transverse and connecting to the interior sidewall; and
an inner diameter edge feature formed between the interior sidewall and the joint sidewall, the inner diameter edge feature having a dimension of less than 0.015 inches (381 µm).

2. The quartz pressure sensor as in claim 1, wherein the inner diameter edge feature comprises a fillet edge.

3. The quartz pressure sensor as in claim 2, wherein the fillet edge has a radius of less than 0.015 inches (381 µm), less than 0.005 inches (~127 µm), between 0.0001 inches to 0.005 inches (~2.54 µm to ~127 µm), 0.01 inches (~254 µm), or 0.000 inches (~0 µm).

4. The quartz pressure sensor as in claim 2, wherein the inner diameter edge feature dimension of less than 0.015 inches (381 µm) reduces the average stress at the first joint or the second joint by between 5% and 50% compared to an inner diameter edge dimension of 0.015 inches (381 µm) or more.

5. The quartz pressure sensor as in claim 1, wherein one or more of the center resonator structure, the first cap, or the second cap comprises quartz.

6. The quartz pressure sensor as in claim 1, wherein the inner diameter edge feature comprises a chamfered edge.

7. The quartz pressure sensor as in claim 6, wherein the chamfered edge has a short-side length of less than 0.015 inches (381 µm), less than 0.005 inches (~127 µm), or 0.01 inches (~254 µm).

8. The quartz pressure sensor as in claim 6, wherein the chamfered edge has a short-side length of between 0.0001 inches to 0.005 inches (~2.54 µm to ~127 µm).

9. The quartz pressure sensor as in claim 6, wherein the chamfered edge forms an angle with a plane in which the joint sidewall lies.

10. The quartz pressure sensor as in claim 9, wherein the angle is greater than 0 degrees and less than 90 degrees.

11. The quartz pressure sensor as in claim 9, wherein the angle is 30 degrees, 45 degrees, or 60 degrees.

12. A quartz pressure sensor that resonates in a thickness-shear mode, comprising:
a center resonator structure; and
a housing bonded to the center resonator structure, the housing comprising:
a first cap bonded to a first side of the center resonator structure, forming a first joint; and
a second cap bonded to a second side of the center resonator structure, forming a second joint,
wherein the first cap or the second cap comprises:
an interior sidewall, the interior sidewall defining a cap bore;
a joint sidewall transverse and connecting to the interior sidewall; and
an inner diameter fillet edge formed between the interior sidewall and the joint sidewall, the inner diameter fillet edge having a radius of less than 0.015 inches (381 µm).

13. The quartz pressure sensor as in claim 12, wherein the fillet edge has a radius of between 0.0001 inches to 0.005 inches (~2.54 µm to ~127 µm).

14. The quartz pressure sensor as in claim 12, wherein the fillet edge has a radius of less than 0.005 inches (~127 µm), 0.01 inches (~254 µm), or 0.000 inches (~0 µm).

15. The quartz pressure sensor as in claim 12, wherein one or more of the center resonator structure, the first cap, or the second cap comprises quartz.

16. The quartz pressure sensor as in claim 12, wherein the inner diameter fillet edge radius of less than 0.015 inches (381 µm) reduces the average stress at the first joint or the second joint by between 5% and 50% compared to an inner diameter edge having a radius of 0.015 inches (381 µm) or more.

17. A quartz pressure sensor that resonates in a thickness-shear mode, comprising:
a center resonator structure; and
a housing bonded to the center resonator structure, the housing comprising:
a first cap bonded to a first side of the center resonator structure, forming a first joint; and
a second cap bonded to a second side of the center resonator structure, forming a second joint,
wherein the first cap or the second cap comprises:
an interior sidewall, the interior sidewall defining a cap bore;
a joint sidewall transverse and connecting to the interior sidewall; and
an inner diameter chamfered edge formed between the interior sidewall and the joint sidewall, the inner diameter chamfered edge having a short-side length of less than 0.015 inches (381 µm).

18. The quartz pressure sensor as in claim 17, wherein the chamfered edge has a short-side length of between 0.0001 inches to 0.005 inches (~2.54 µm to ~127 µm), less than 0.005 inches (~127 µm), or 0.01 inches (~254 µm).

19. The quartz pressure sensor as in claim 17, wherein the chamfered edge forms an angle with a plane in which the joint sidewall lies.

20. The quartz pressure sensor as in claim 19, wherein the angle is 30 degrees, 45 degrees, 60 degrees, or greater than 0 degrees and less than 90 degrees.

* * * * *